United States Patent
Sung et al.

(10) Patent No.: US 10,825,825 B2
(45) Date of Patent: Nov. 3, 2020

(54) FLASH MEMORY STRUCTURE

(71) Applicant: TAIWAN SEMICONDUCTOR MANUFACTURING CO., LTD., Hsinchu (TW)

(72) Inventors: Fu-Ting Sung, Taoyuan County (TW); Chung-Chiang Min, Hsinchu County (TW); Wei-Hang Huang, Kaohsiung (TW); Shih-Chang Liu, Kaohsiung (TW); Chia-Shiung Tsai, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/510,043

(22) Filed: Jul. 12, 2019

(65) Prior Publication Data

US 2019/0333926 A1  Oct. 31, 2019

Related U.S. Application Data

(60) Division of application No. 15/855,940, filed on Dec. 27, 2017, now Pat. No. 10,355,011, which is a
(Continued)

(51) Int. Cl.
*H01L 27/11568* (2017.01)
*H01L 29/78* (2006.01)
(Continued)

(52) U.S. Cl.
CPC ........ *H01L 27/11568* (2013.01); *H01L 21/28* (2013.01); *H01L 21/76805* (2013.01);
(Continued)

(58) Field of Classification Search
CPC ......... H01L 27/11517; H01L 27/11568; H01L 21/76805; H01L 21/28273; H01L 29/7831;
(Continued)

(56) References Cited

U.S. PATENT DOCUMENTS 8,422,304 B2   4/2013  Kim
9,564,448 B2 *  2/2017  Sung ................. H01L 29/40114
(Continued)

FOREIGN PATENT DOCUMENTS

KR   10-2009-0014967 A   2/2009
KR   10-2011-0065892       6/2011
KR   10-2011-0068769       6/2011

*Primary Examiner* — Changhyun Yi
(74) *Attorney, Agent, or Firm* — Birch, Stewart, Kolasch & Birch, LLP

(57) ABSTRACT

Semiconductor structures are provided. The semiconductor structure includes a substrate and a first gate electrode formed over the substrate. The semiconductor structure further includes a dielectric layer formed on a sidewall of the first gate electrode and a second gate electrode formed over the substrate and separated from the first gate electrode by the dielectric layer. The semiconductor structure further includes a contact formed over the second gate electrode. In addition, the contact has a first extending portion and a second extending portion extending along opposite sidewalls of the second gate electrode.

20 Claims, 26 Drawing Sheets

Related U.S. Application Data continuation of application No. 15/425,647, filed on Feb. 6, 2017, now Pat. No. 9,859,295, which is a division of application No. 14/718,171, filed on May 21, 2015, now Pat. No. 9,564,448, which is a continuation of application No. 14/013,653, filed on Aug. 29, 2013, now Pat. No. 9,048,316.

(51) Int. Cl.

| | | |
|---|---|---|
| H01L 21/28 | (2006.01) | |
| H01L 29/34 | (2006.01) | |
| H01L 29/423 | (2006.01) | |
| H01L 29/66 | (2006.01) | |
| H01L 29/788 | (2006.01) | |
| H01L 27/11521 | (2017.01) | |
| H01L 23/528 | (2006.01) | |
| H01L 29/49 | (2006.01) | |
| H01L 21/768 | (2006.01) | |

(52) U.S. Cl.
CPC ...... *H01L 23/528* (2013.01); *H01L 27/11521* (2013.01); *H01L 29/34* (2013.01); *H01L 29/40114* (2019.08); *H01L 29/40117* (2019.08); *H01L 29/4234* (2013.01); *H01L 29/42324* (2013.01); *H01L 29/4916* (2013.01); *H01L 29/66825* (2013.01); *H01L 29/788* (2013.01); *H01L 29/7831* (2013.01); *H01L 29/7881* (2013.01); *H01L 2924/0002* (2013.01)

(58) Field of Classification Search
CPC ............. H01L 27/11521; H01L 27/115; H01L 21/336; H01L 29/788; G11C 16/16
See application file for complete search history.

(56) References Cited

U.S. PATENT DOCUMENTS

| | | |
|---|---|---|
| 2003/0198086 A1 | 10/2003 | Shukuri |
| 2004/0018750 A1 | 1/2004 | Sophie et al. |
| 2005/0212057 A1 | 9/2005 | Tokuda et al. |
| 2006/0170029 A1 | 8/2006 | Liu et al. |
| 2007/0155153 A1 | 7/2007 | Okazaki et al. |
| 2009/0050956 A1 | 2/2009 | Ishimaru et al. |
| 2009/0309153 A1 | 12/2009 | Yanagi et al. |
| 2010/0054043 A1 | 3/2010 | Liu et al. |
| 2010/0163953 A1 | 7/2010 | Jeong |
| 2010/0164019 A1 | 7/2010 | Jeong |
| 2011/0244640 A1 | 10/2011 | Lin et al. |
| 2011/0272753 A1* | 11/2011 | Funayama ........ H01L 27/11565 257/299 |
| 2012/0068243 A1 | 3/2012 | Kawashima et al. |
| 2013/0082315 A1 | 4/2013 | Hosoda et al. |
| 2014/0175533 A1 | 6/2014 | Kwon |

\* cited by examiner

FLASH MEMORY STRUCTURE

CROSS REFERENCE TO RELATED APPLICATIONS

This application is a Divisional application of U.S. patent application Ser. No. 15/855,940, filed on Dec. 27, 2017, the entire of which is incorporated by reference herein. The U.S. patent application Ser. No. 15/855,940 is a Continuation application of U.S. patent application Ser. No. 15/425,647, filed on Feb. 6, 2017, the entire of which is incorporated by reference herein. The U.S. patent application Ser. No. 15/425,647 is a Divisional application of U.S. patent application Ser. No. 14/718,171, filed on May 21, 2015, the entire of which is incorporated by reference herein. The U.S. patent application Ser. No. 14/718,171 is a Continuation application of U.S. patent application Ser. No. 14/013,653, filed on Aug. 29, 2013, the entire of which is also incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

A split-gate flash memory cell has elements such as a floating gate and source and drain regions. However, controlling and shrinking the size of those elements in a split-gate flash memory cell are still challenging.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1:
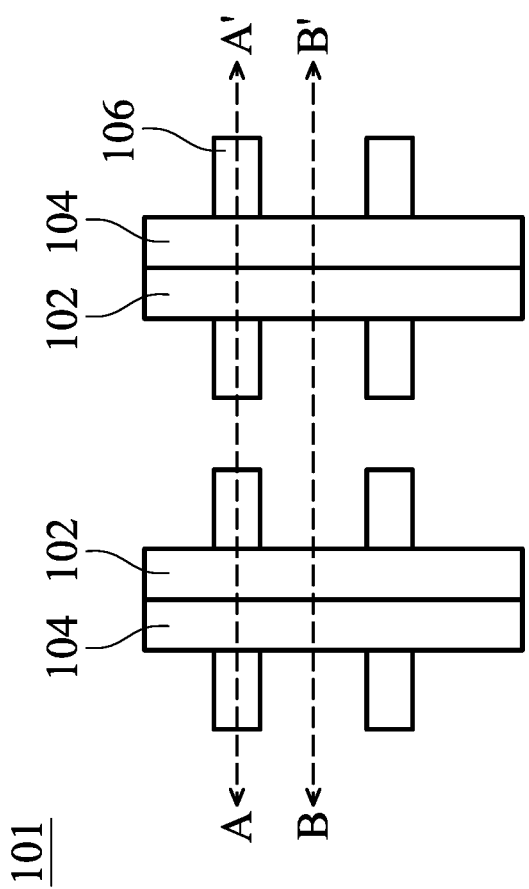
FIG. 1 illustrates a top view representation of a flash memory structure in accordance with some embodiments.

Embodiments for forming a semiconductor device structure are provided in accordance with some embodiments of the disclosure. FIG. 1 illustrates a top view representation of a flash memory structure in accordance with some embodiments. As shown in FIG. 1, shallow trench isolations (STIs) 106 are formed in a substrate 101. In some embodiments, STIs 106 are made of insulating materials, such as silicon dioxide. STIs 106 may be formed by etching trenches in substrates 101 and filling an insulating material into the trenches by chemical vapor deposition (CVD) afterwards.

After STIs 106 are formed, word line cells 102 are formed over substrate 101 across STIs 106 in accordance with some embodiments. In addition, memory gates 104 are formed adjacent to word line cells 102 over substrate 101. Details of the flash memory structure in FIG. 1 will be further described in the following descriptions.

Figure 2A:
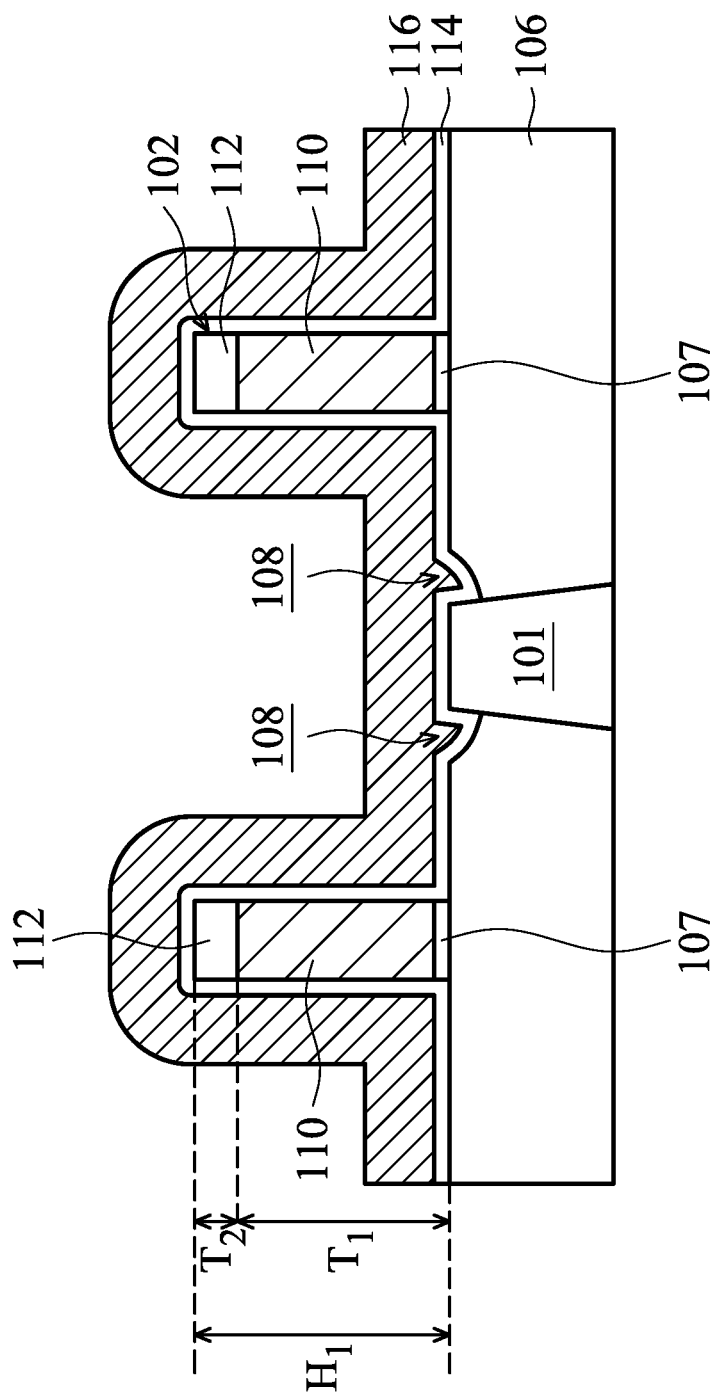
FIGS. 2A to 2J illustrate cross-sectional representations of various stages of forming a flash memory structure along with A-A' in FIG. 1 in accordance with some embodiments.

FIGS. 2A to 2J illustrate cross-sectional representations of various stages of forming a flash memory structure along with A-A" in FIG. 1 in accordance with some embodiments. Referring to FIG. 2A, word line cell 102 is formed across STI 106 over substrate 101 in accordance with some embodiments. Word line cell 102 includes a control gate and an insulating layer 112, and control gate includes a first poly silicon layer 110 and a gate dielectric layer 107 in accordance with some embodiments. In some embodiments, insulating layer 112 is made of SiN, SiON, or other applicable dielectric materials. In some embodiments, gate dielectric layer 107 is made of silicon oxide or other applicable dielectric materials. It should be noted that, although insulating layer 112 shown in FIG. 2A is a single layer, insulating layer 112 may also include multilayers.

Word line cell 102 may be formed by depositing first polysilicon layer 110 over substrate 101, depositing insulating layer 112 over polysilicon layer 110, and patterning first poly silicon layer 110 and insulating layer 112. In some embodiments, first polysilicon layer 110 and insulating layer 112 are formed by CVD. In some embodiments, first polysilicon layer 110 and insulating layer 112 are formed by Furnace. In some embodiments, first polysilicon layer 110 and insulating layer 112 are patterned by forming a photoresist layer over insulating layer 112, patterning the photoresist layer, and etching insulating layer 112 and polysilicon layer 110. In some embodiments, insulating layer 112 and first polysilicon layer 110 are patterned by an anisotropic dry etching process.

In some embodiments, control gate has a thickness $T_1$, and insulating layer 112 has a thickness $T_2$. In addition, word line cell 102 has a height $H_1$, which is a sum of $T_1$ and $T_2$.

After word line cell 102 is formed, a dielectric layer 114 is conformally formed over substrate 101 to cover word line cell 102, as shown in FIG. 2A in accordance with some embodiments. In some embodiments, dielectric layer 114 is an oxide-nitride-oxide (ONO) film. In some embodiments, dielectric layer 114 is formed by CVD.

After dielectric layer 114 is formed, a second polysilicon layer 116 is conformally formed over dielectric layer 114 as shown in FIG. 2A in accordance with some embodiments. In some embodiments, second polysilicon layer 116 is formed by CVD. In some embodiments, second polysilicon layer 116 is formed by Furnace.

It should be noted that, at the top surface of STI 106, divots 108 are formed due to isotropic wet etch process during STIs formation. When dielectric layer 114 and second poly silicon layer 116 are formed over substrate 101, dielectric material of dielectric layer 114 and polysilicon of polysilicon layer 116 also fill in divots 108.

Figure 2B:
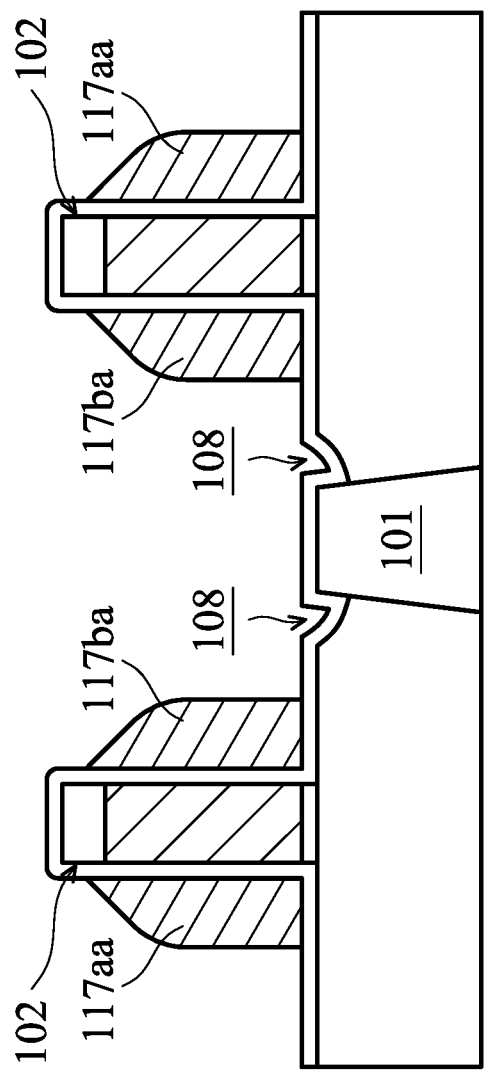

Next, an etching process is performed to remove some portions of second polysilicon layer 116 and form polysilicon spacers, as shown in FIG. 2B in accordance with some embodiments. In some embodiments, second polysilicon layer 116 is etched by an anisotropic dry etching process. The polysilicon spacers, including a first polysilicon spacer 117aa and a second polysilicon spacer 117ba, are formed along sidewalls of word line cell 102 and have slanted (or sloping) top surfaces. In addition, in some embodiments, in order to remove polysilicon within divots 108, polysilicon layer 116 is over-etched. However, when polysilicon layer 116 is over-etched, first polysilicon spacer 117aa and second polysilicon spacer 117ba have low average heights.

Figure 2C:
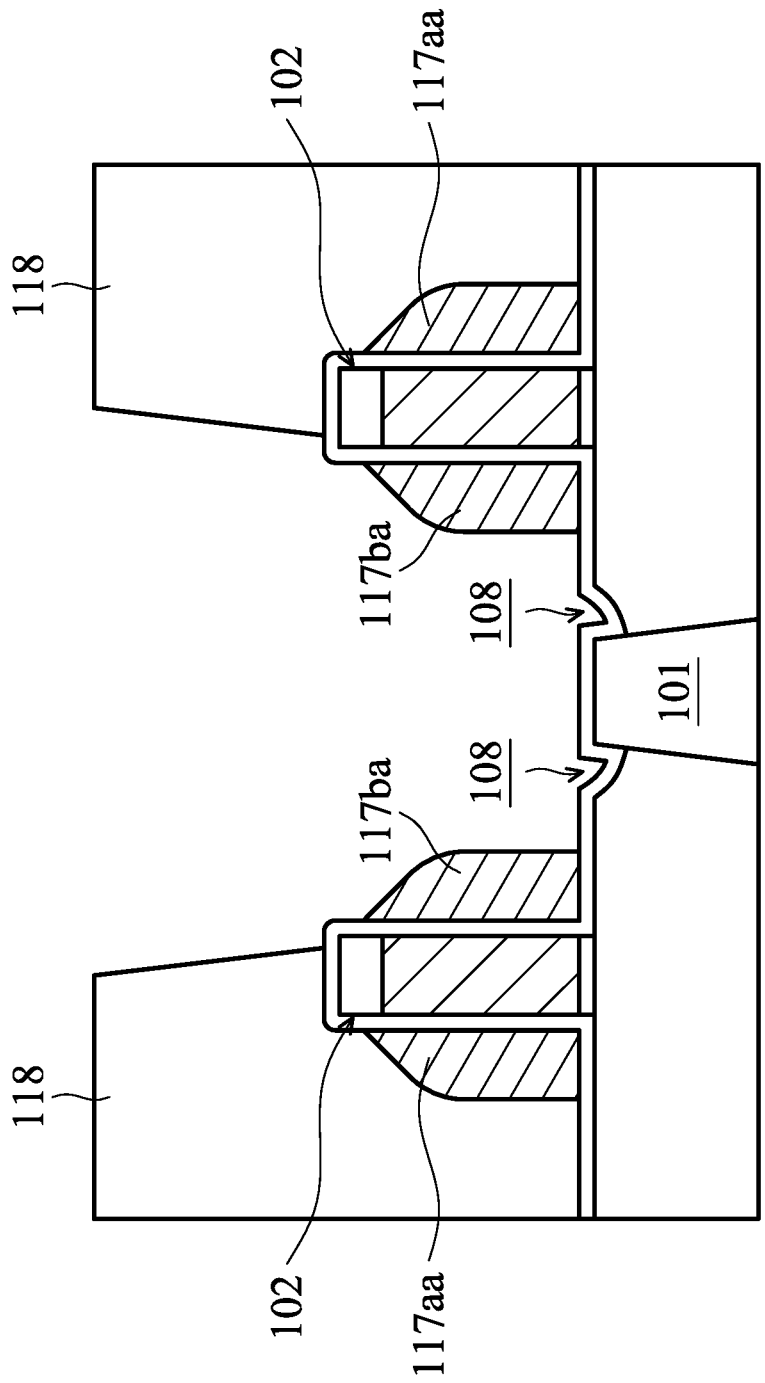

Next, resist layer 118 is formed to cover first polysilicon spacer 117aa, as shown in FIG. 2C in accordance with some embodiments. In some embodiments, resist layer 118 is formed by forming a photoresist layer and patterning the photoresist layer afterwards. As shown in FIG. 2C, resist layer 118 also covers portions of word line cell 102 in accordance with some embodiments.

Figure 2D:
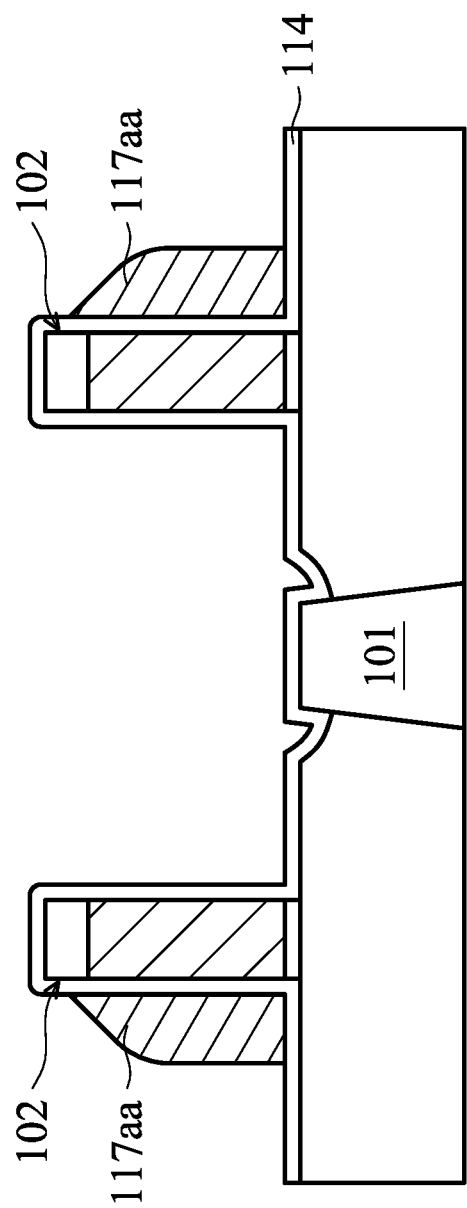

After resist layer 118 is formed, second polysilicon spacer 117ba is removed, as shown in FIG. 2D in accordance with some embodiments. In some embodiments, second polysilicon spacer 117ba is not covered by resist layer 118 and is removed by an isotropic dry etching process.

Figure 2E:
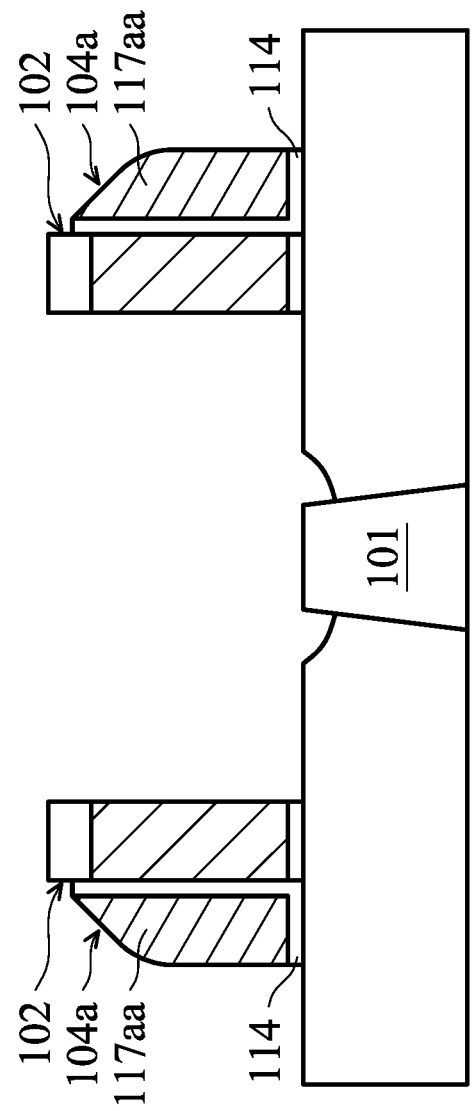

Afterwards, an etching process is performed to remove exposed portions of dielectric layer 114, as shown in FIG. 2E in accordance with some embodiments. In some embodiments, the etching process is a wet etching process. First polysilicon spacer 117aa can be seen as a memory gate 104a adjacent to word line cell 102 and is separated with word line cell 102 by dielectric layer 114.

Figure 2F:
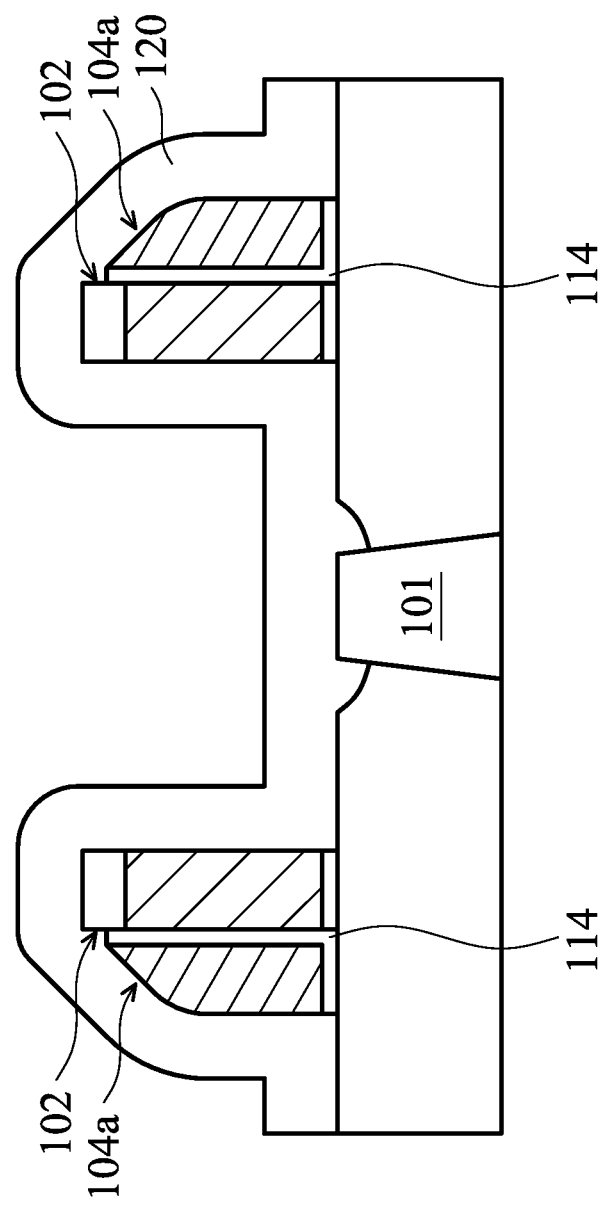

After memory gate 104a is formed, source extension regions and drain extension regions may be formed in substrate 101 (not shown), and spacers are formed along sidewalls of word line cell 102 and memory gate 104 afterwards. More specifically, an insulating film 120 is conformally formed over substrate 101 to cover word line cell 102 and memory gate 104a, as shown in FIG. 2F in accordance with some embodiments. In some embodiments, insulating film 120 is made of silicon nitride, silicon dioxide, silicon oxide, or other applicable insulating materials. In some embodiments, insulating film 120 is formed by CVD. It should be noted that, although insulating film 120 shown in FIG. 2F only includes a single layer, in some other embodiments, insulating film 120 also include multilayers.

Figure 2G:
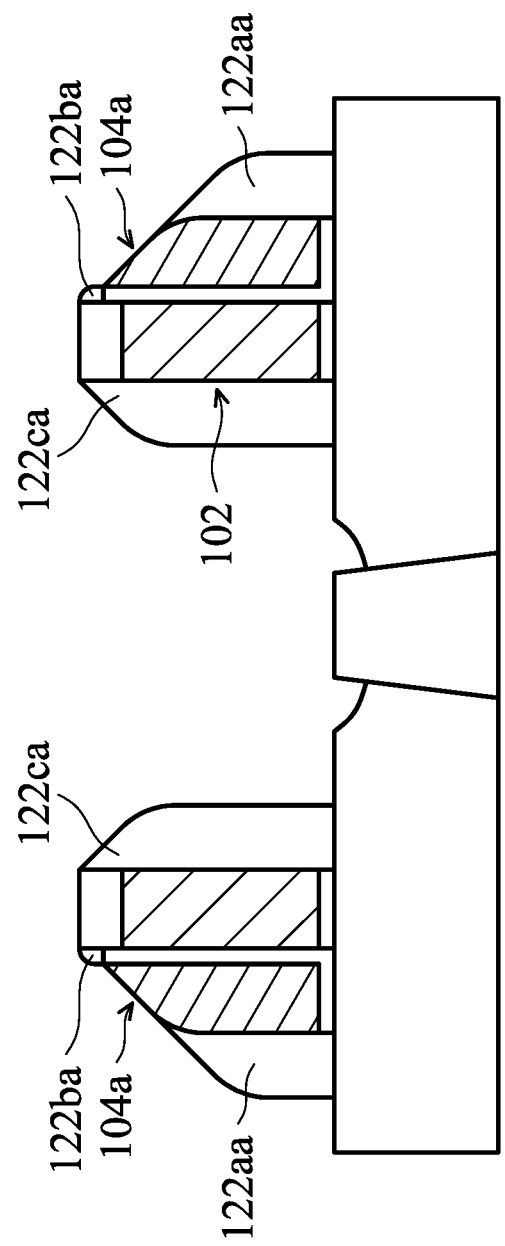

Next, insulating film 120 is etched to form spacers 122aa, 122ba, and 122ca, as shown in FIG. 2G in accordance with some embodiments. In some embodiments, insulating film 120 is etched by an anisotropic dry etching process. Spacer 122aa is formed at one sidewall of memory gate 104a, and spacers 122ba and 122ca are formed on both sidewalls of word line cell 102. Since memory gate 104a has a slanted top surface, removal of insulating film 120 formed thereon requires a long time for etching. Therefore, an average height of spacers, especially spacer 122aa, is reduced. After the spacers are formed, source and drain regions (not shown) may be formed in substrate 101.

Figure 2H:
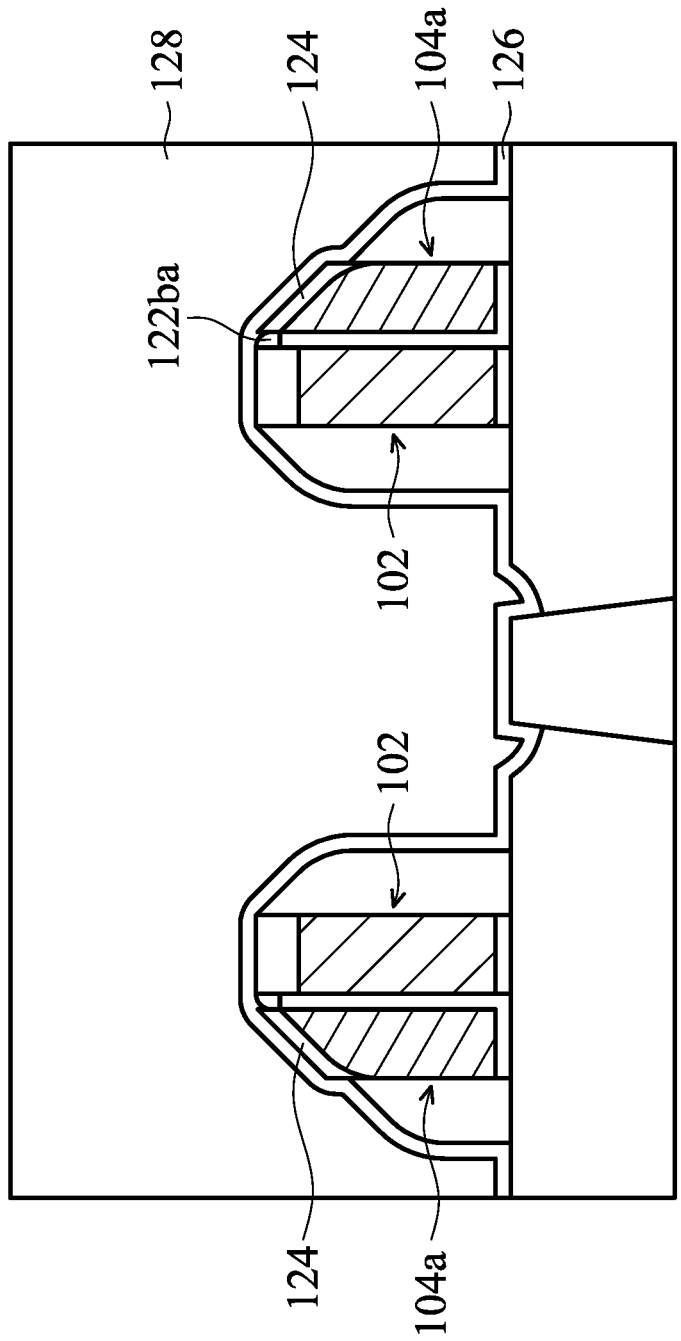
Figure 2:
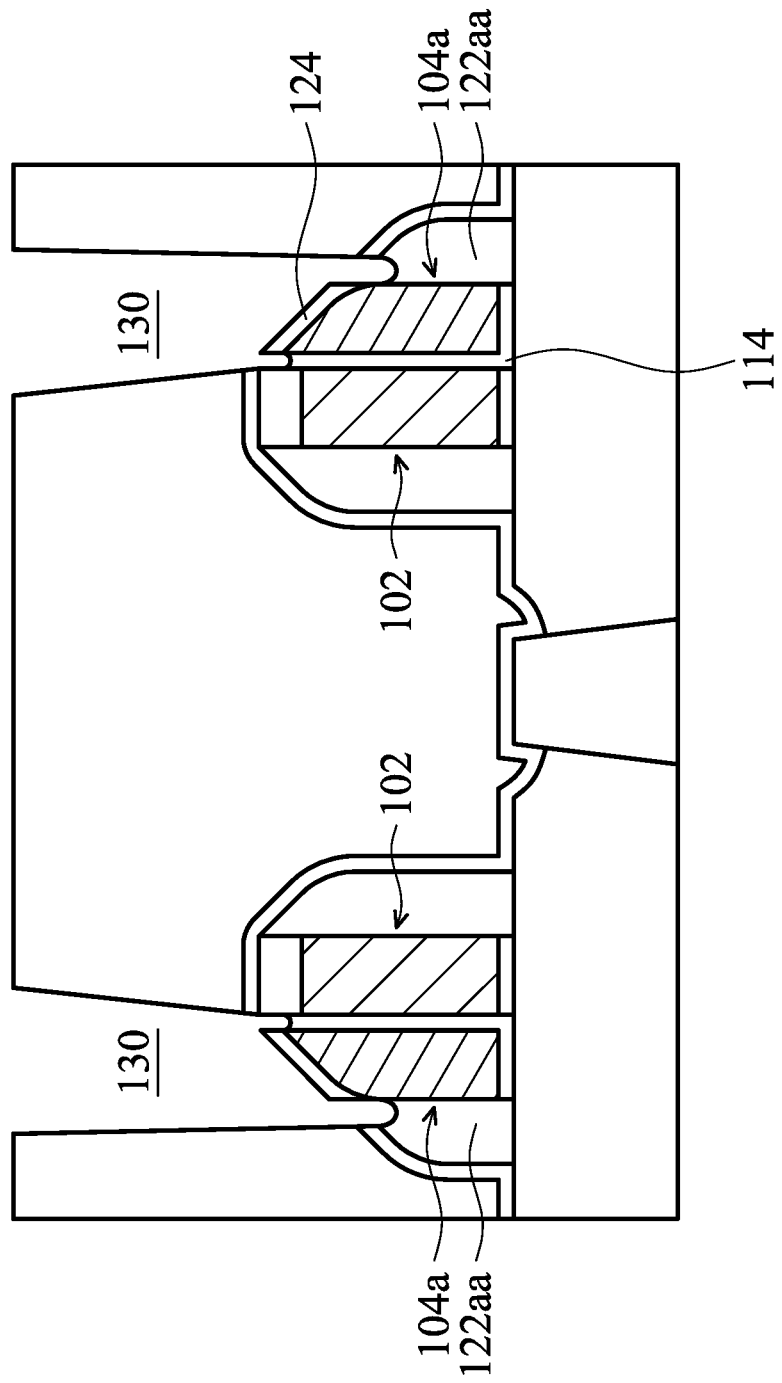

Next, a silicide layer 124 is formed over memory gate 104a, as shown in FIG. 2H in accordance with some embodiments. In some embodiments, silicide layer 124 is made of nickel silicide, cobalt silicide, or titanium silicide. In some embodiments, silicide layer 124 is formed on memory gate 104a by a resist protective oxide (RPO) process.

Afterwards, a contact etch stop layer 126 is conformally formed over substrate 101 to cover word line cell 102 and memory gate 104, as shown in FIG. 2H in accordance with some embodiments. In some embodiments, contact etch stop layer 126 is made of dielectric materials such as SiN or SiON. In some embodiments, contact etch stop layer 126 is formed by CVD. After contact etch stop layer 126 is formed, an interlayer dielectric layer 128 is formed on contact etch stop layer 126 over substrate 101 in accordance with some embodiments. In some embodiments, interlayer dielectric layer 128 is an extremely-low dielectric constant (ELK) interlayer dielectric layer. In some embodiments, interlayer dielectric layer 128 is made of fluorine-doped silicon dioxide, carbon-doped silicon dioxide, or other applicable dielectric materials. Interlayer dielectric layer 128 may be formed by CVD.

After interlayer dielectric layer 128 is formed, an opening 130 is formed through interlayer dielectric layer 128 over memory gate 104a, as shown in FIG. 2I in accordance with some embodiments. In some embodiments, opening 130 is formed by an etching process. In order to completely remove contact etch stop layer 126 over memory gate 104a (e.g. over silicide layer 124), portions of spacer 122aa are also etched. Therefore, opening 130 further extends into spacer 122aa. In addition, portions of dielectric layer 114 and spacer 122ba are also etched in accordance with some embodiments.

Figure 2J:
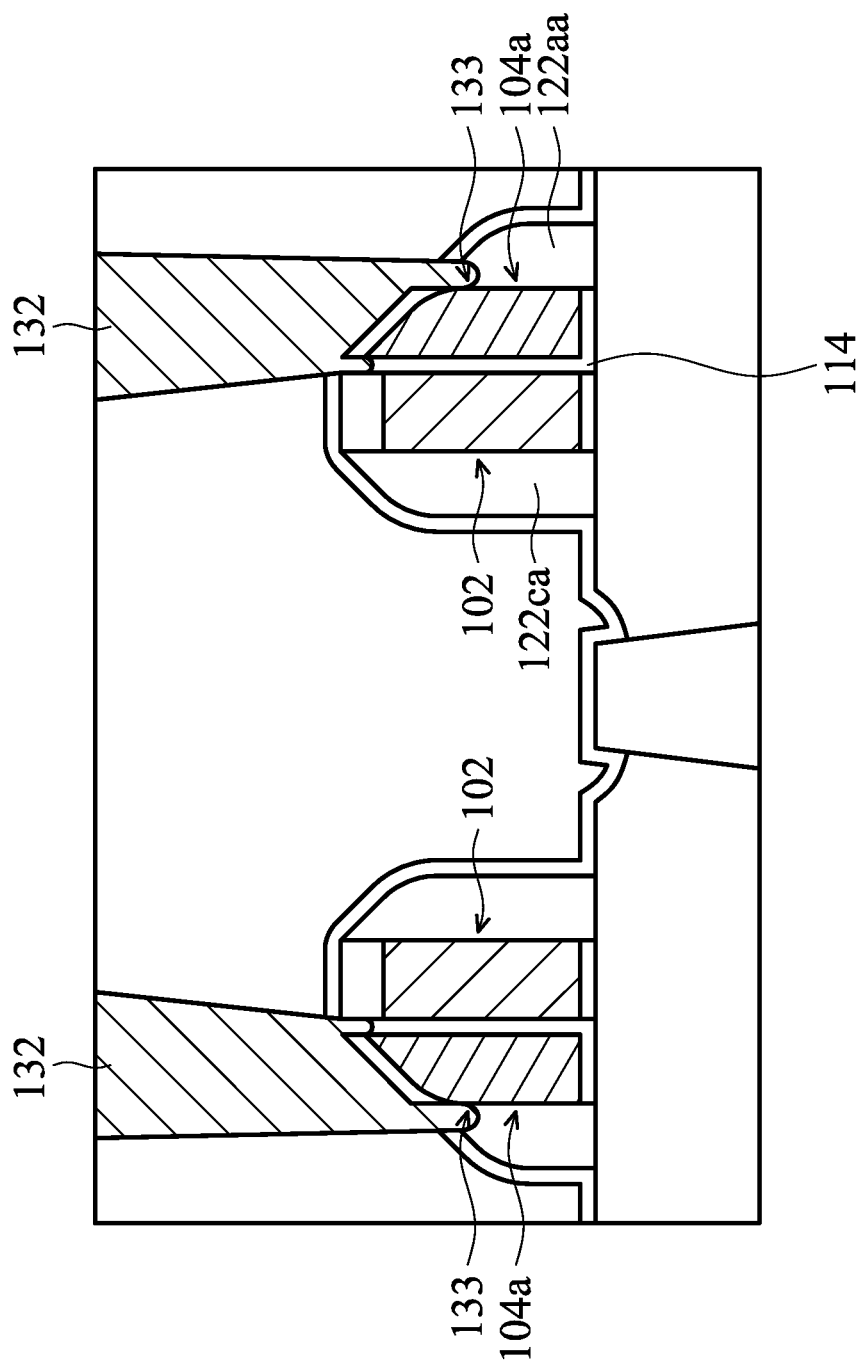

Next, contact 132 is formed in opening 130, as shown in FIG. 2J in accordance with some embodiments. In some embodiments, contact 132 is formed by filling opening 130 with conductive materials such as W, Cu, Ta, Ti, TaN, or TiN. Contact 132 may also include a barrier layer (not shown) on the sidewalls of opening 130, and the barrier layer may be made of TaN, TiN, or CoW. As shown in FIG. 2J, contact 132 has an extending portion 133 that extends into spacer 122aa.

As mentioned previously, memory gate 104a is adjacent to word line cell 102 and is formed by etching polysilicon layer 116 without using any mask structure. However, in order to remove all the polysilicon (e.g. portions of polysilicon layer 116) within divots 108, polysilicon layer 116 is over-etched. Therefore, memory gate 104a has a relatively low average height. In addition, spacer 122aa formed at a sidewall of memory gate 104a has an average height even lower than the average height of memory gate 104a due to the slanted top surface. As a result, when contact 132 has extending portion 133 extending into spacer 122aa, a distance between substrate 101 (or STI 106 as shown in FIG. 2J) and extending portion 133 of contact 132 is relatively short. However, since the distance between contact 132 and substrate 101 is short, leakage occurs when the working voltage of the flash memory structure is high during operation. In some cases, extending portion 133 of contact 132 may even directly contact substrate 101 (or STI 106), resulting in serious leakage problems.

Figure 3A:
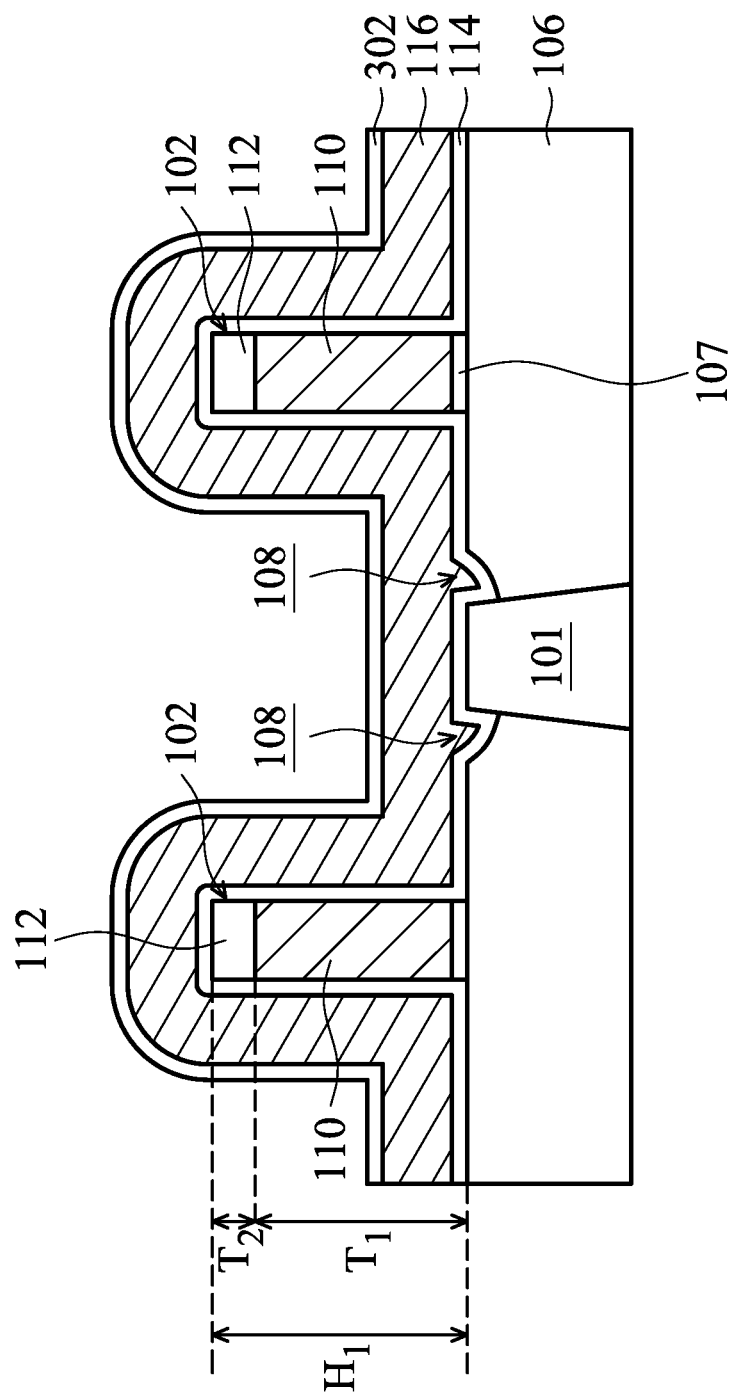
FIGS. 3A to 3N illustrate cross-sectional representations of various stages of forming another flash memory structure along with A-A' in FIG. 1 in accordance with some embodiments.
Figure 3B:
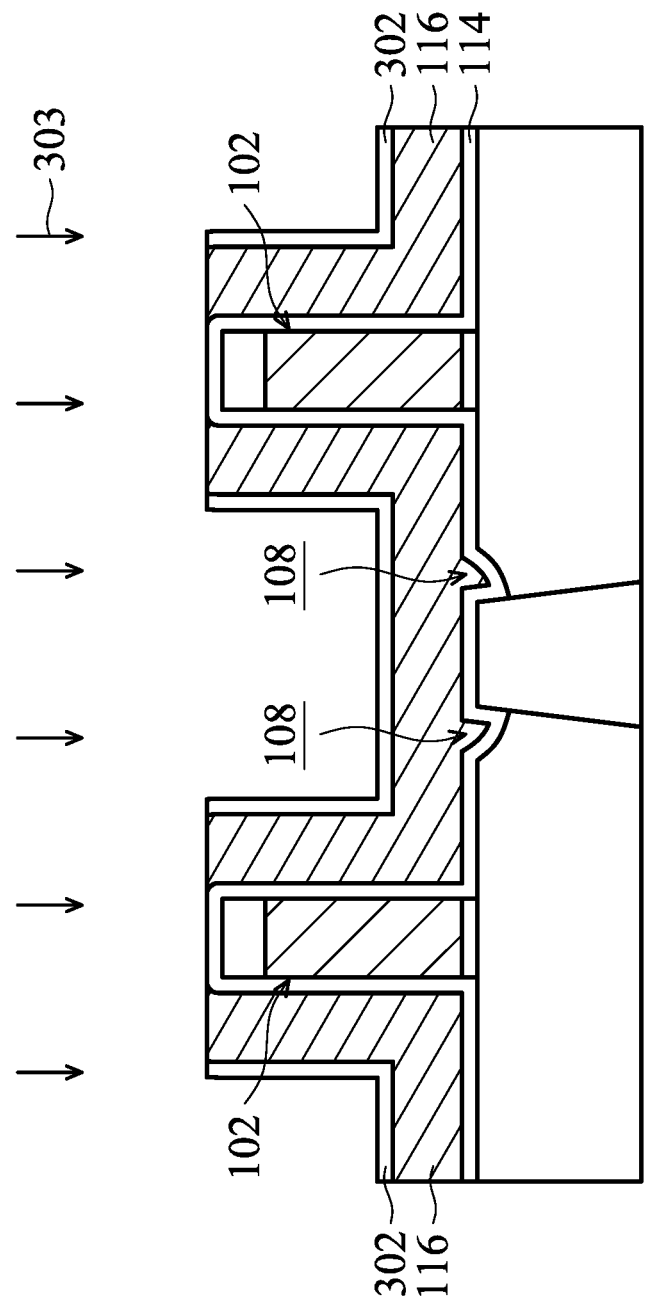
Figure 3C:
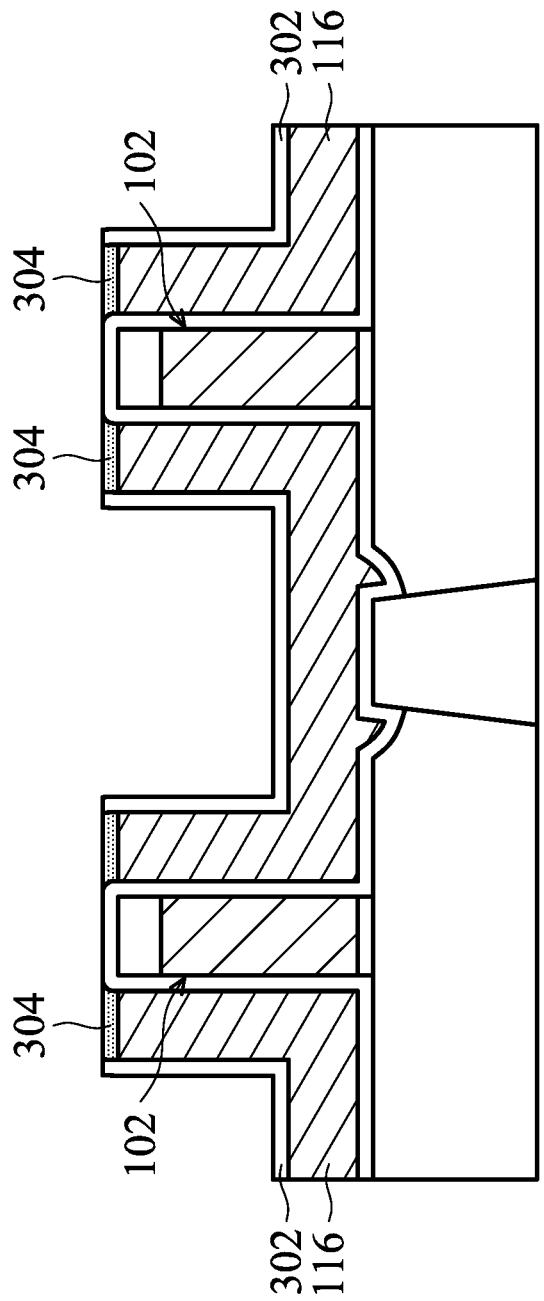
Figure 3D:
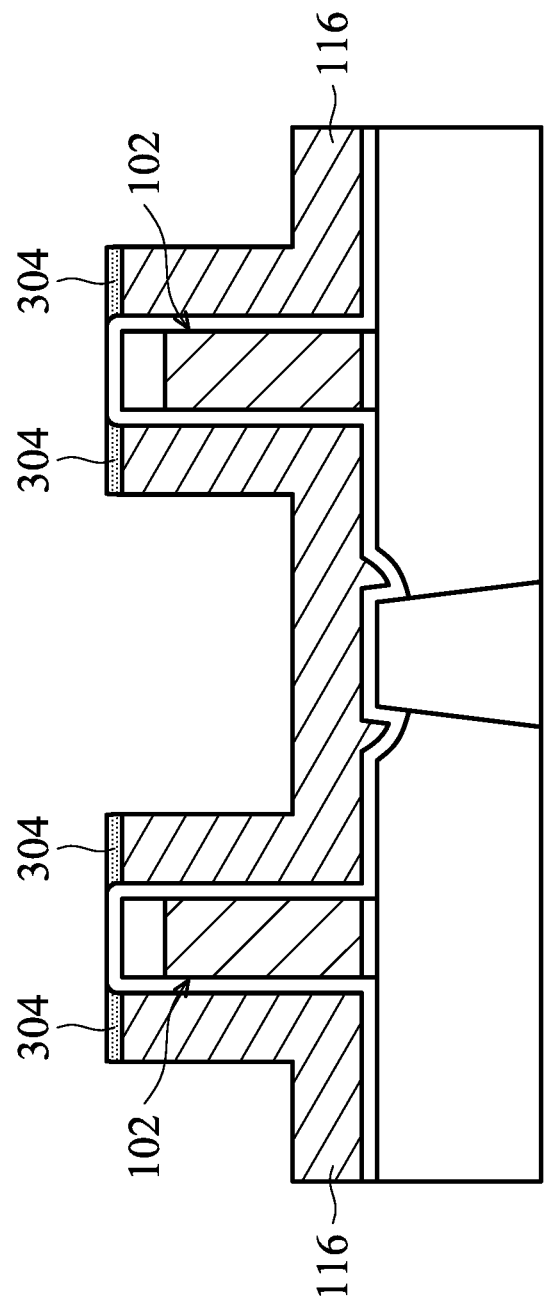
Figure 3E:
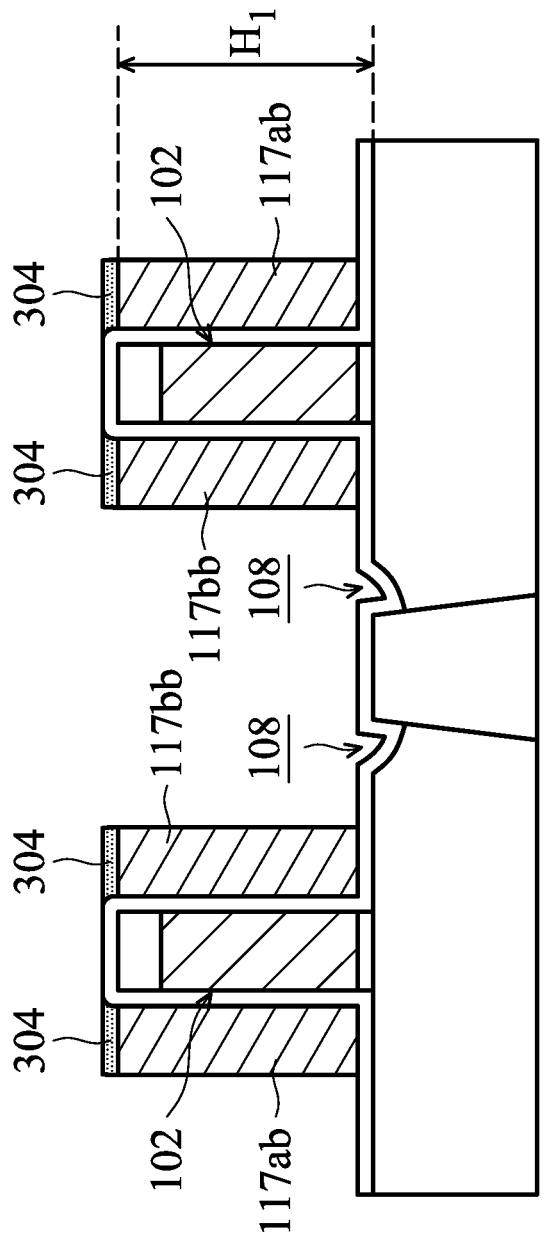
Figure 3F:
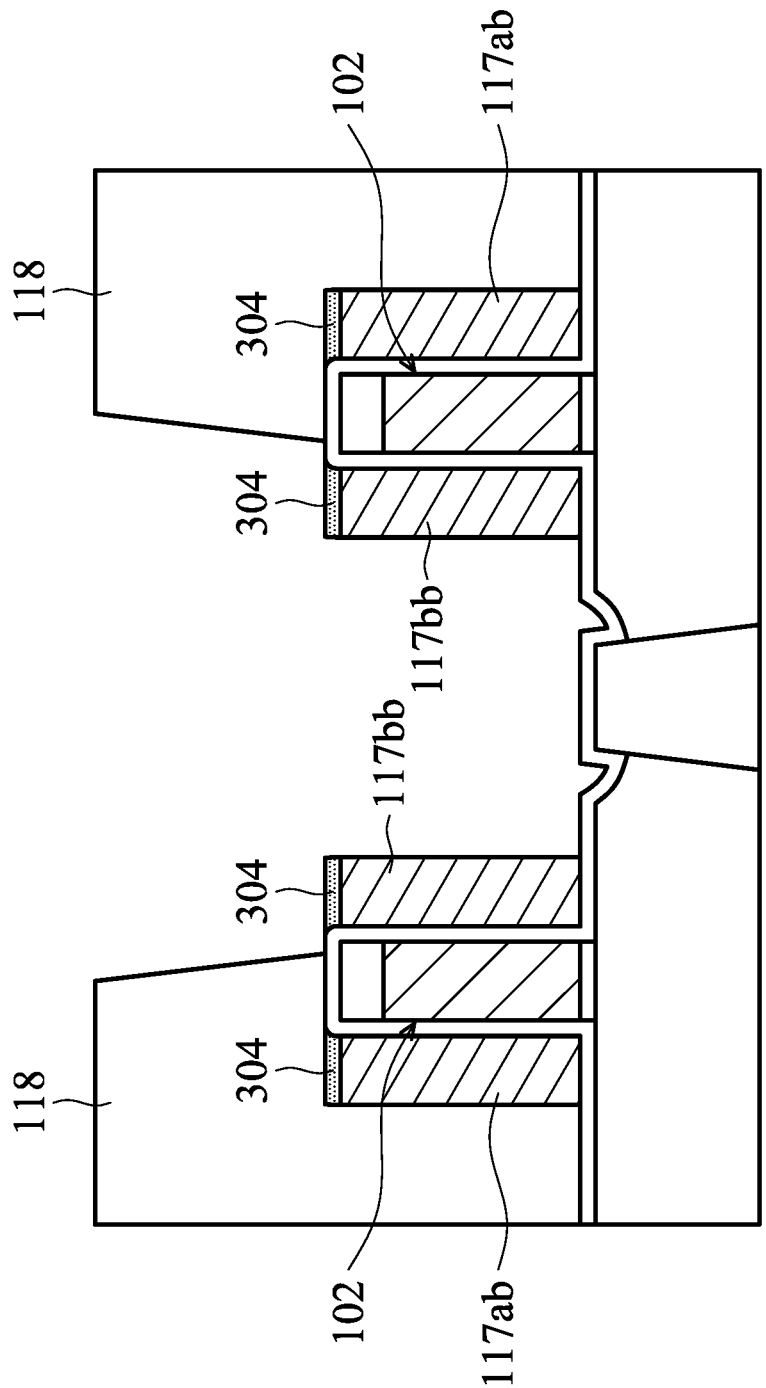
Figure 3G:
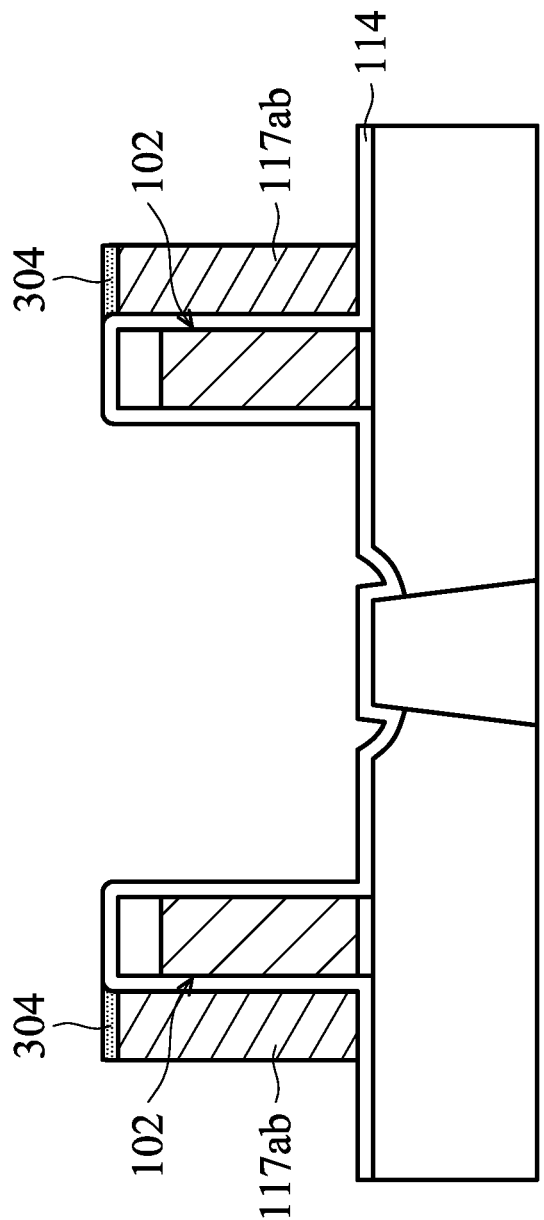
Figure 3H:
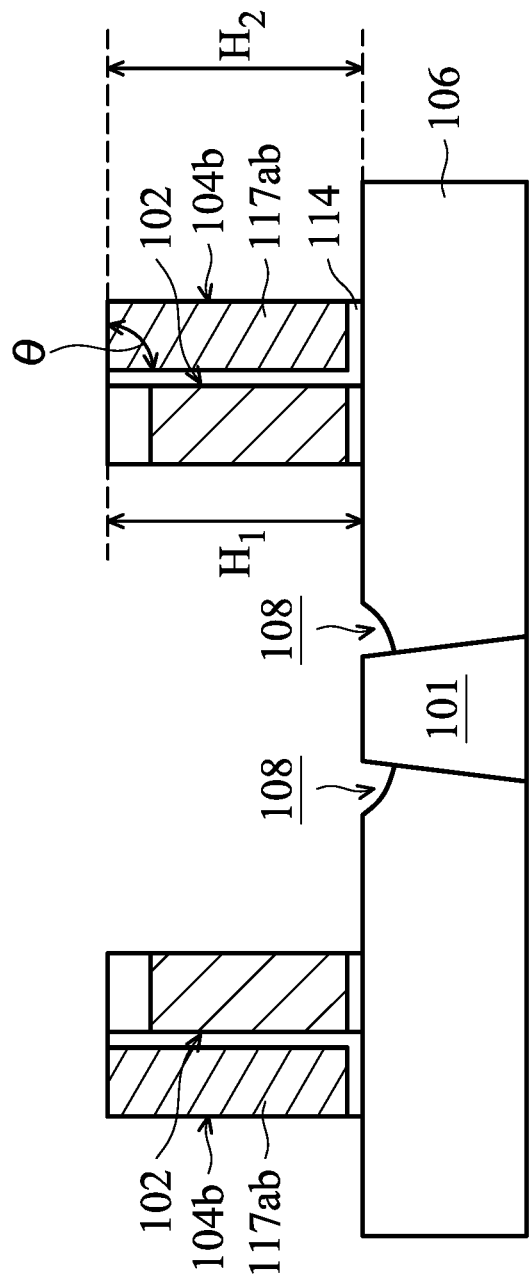
Figure 3:
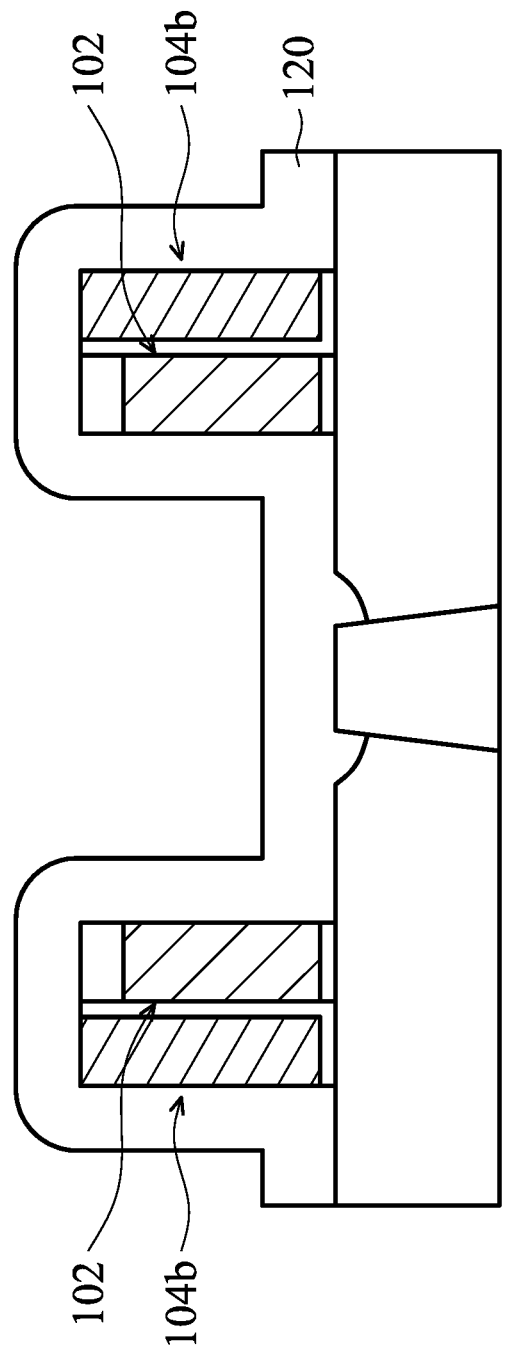
Figure 3J:
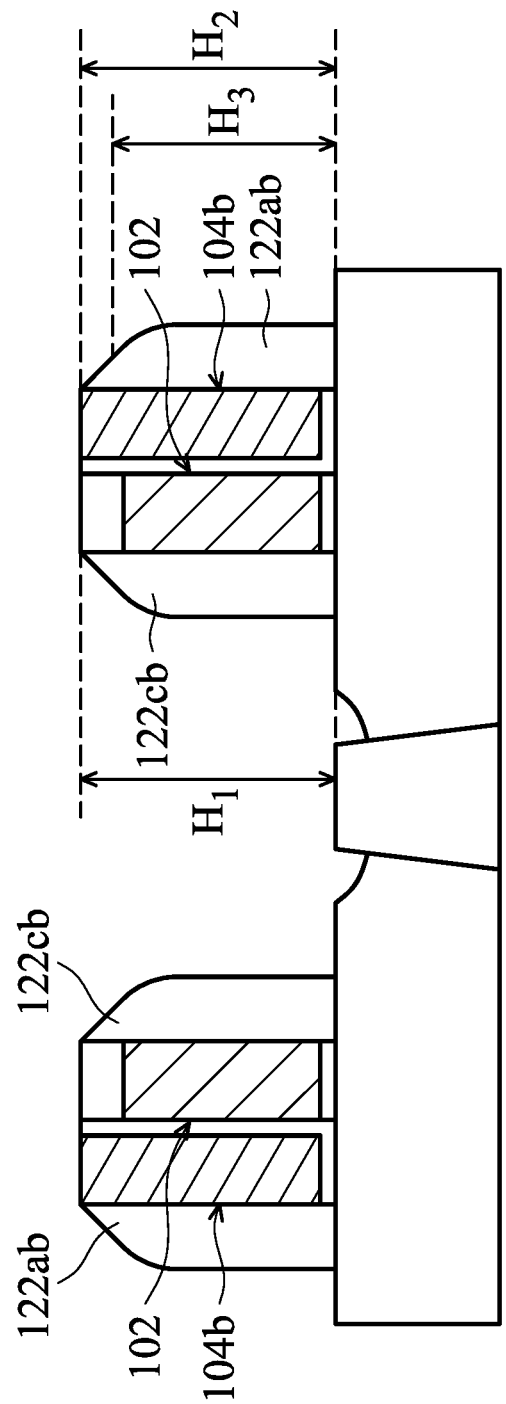
Figure 3K:
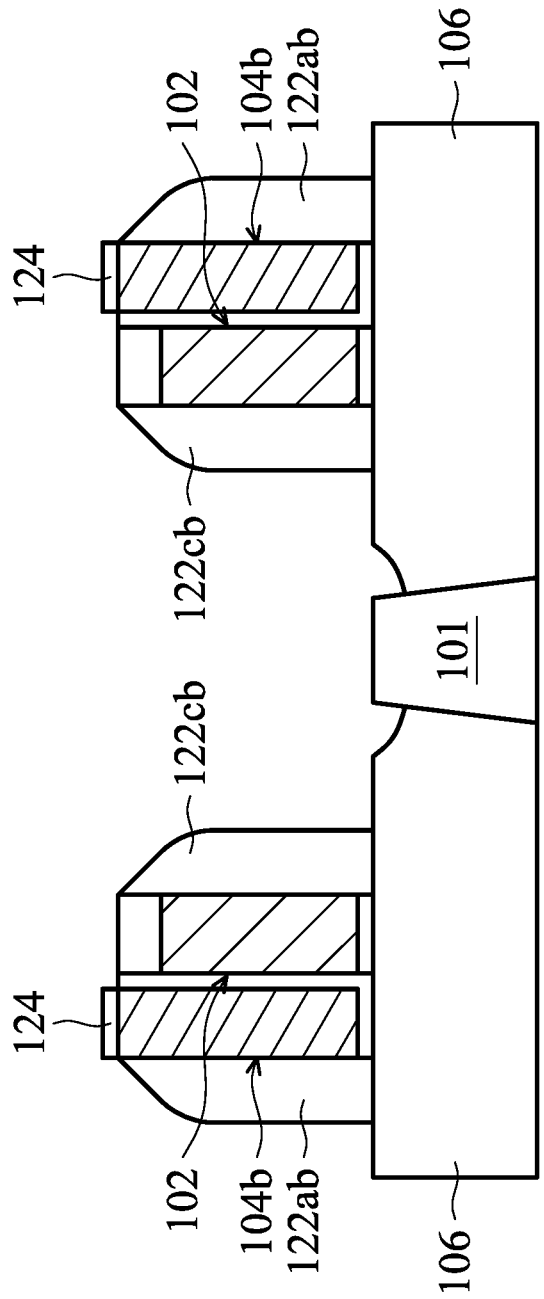
Figure 3L:
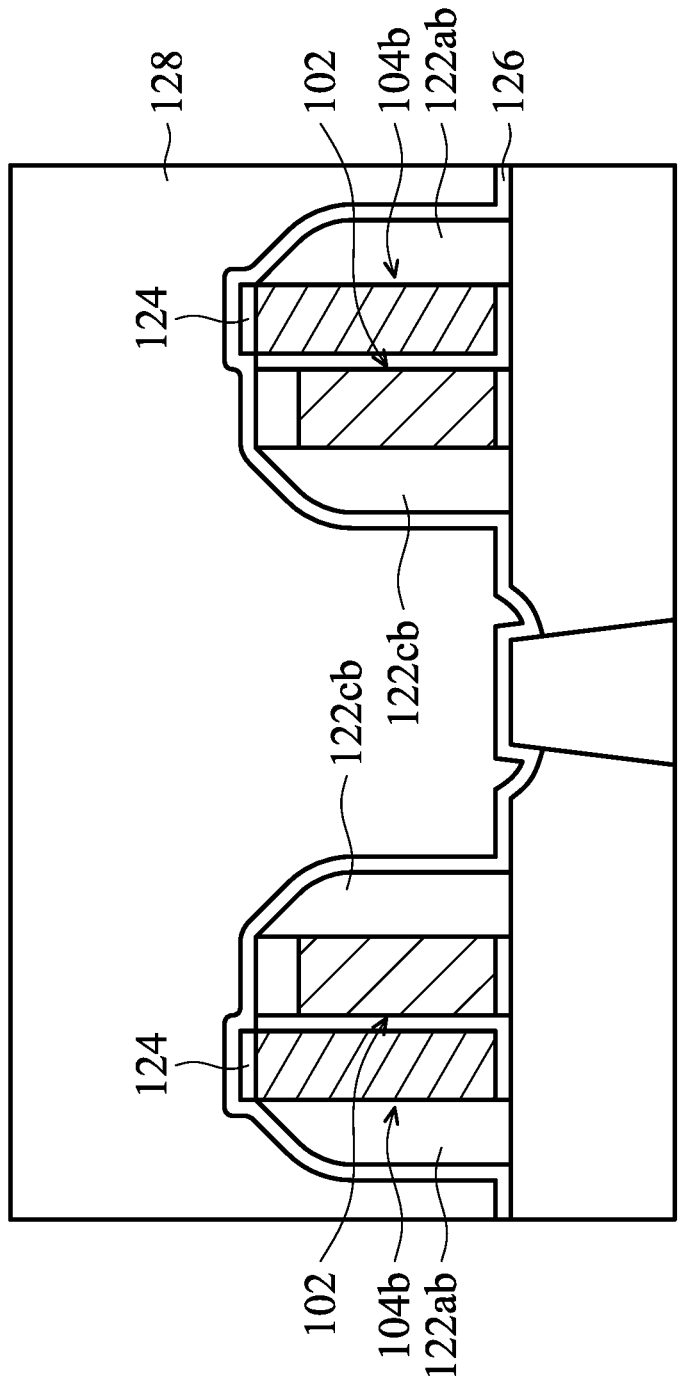
Figure 3M:
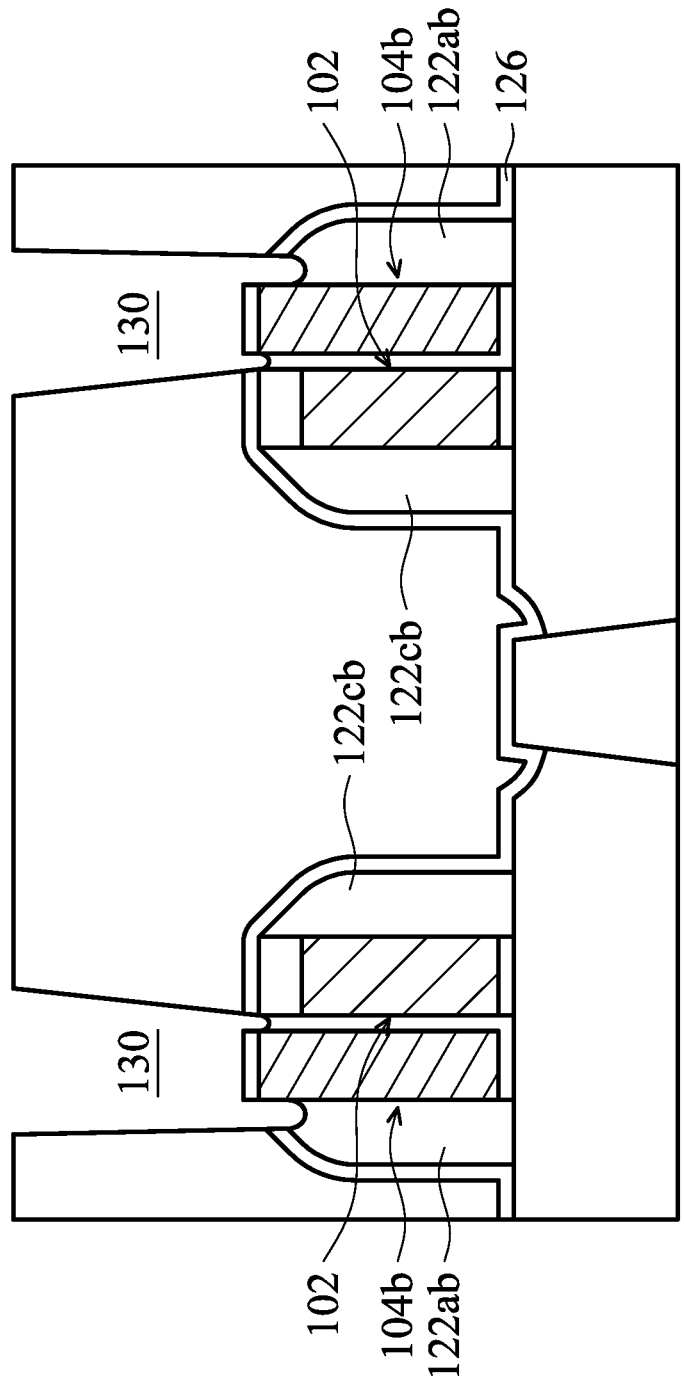
Figure 3N:
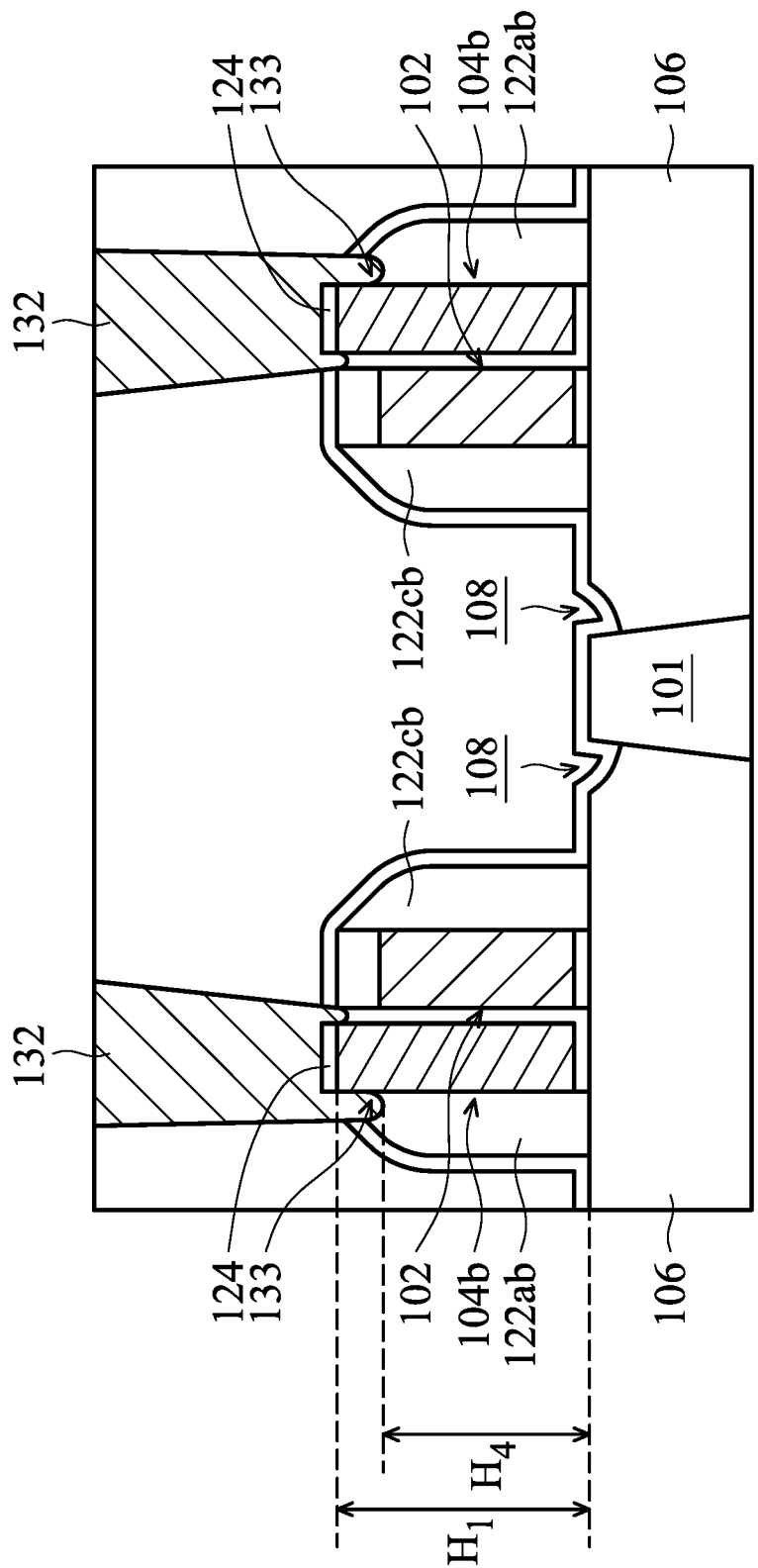

FIGS. 3A to 3N illustrate cross-sectional representations of various stages of forming another flash memory structure along with A-A' in FIG. 1 in accordance with some embodiments. The structure in FIG. 3A is similar to or the same as the structure in FIG. 2A except a capping layer 302 is formed.

More specifically, word line cell 102 is formed across STI 106 over substrate 101, and word line cell 102 includes a control gate and an insulating layer 112, as shown in FIG. 3A in accordance with some embodiments. In some embodiments, control gate has thickness $T_1$ in a range from about 500 A to about 1000 A, and insulating layer 112 has thickness $T_2$ in a range from about 250 A to about 600 A. In some embodiments, word line cell 102 has height $H_1$ (which is the sum of thickness $T_1$ and thickness $T_2$) in a range from about 750 A to about 1600 A.

As shown in FIG. 3A, dielectric layer 114 and second poly silicon layer 116 are conformally formed over substrate 101 to cover word line cell 102 in accordance with some embodiments. In some embodiment, a thickness of second polysilicon layer 116 is in a range from about 200 A to about 600 A. After dielectric layer 114 and second polysilicon layer 116 are formed, capping layer 302 is conformally formed over second polysilicon layer 116 in accordance with some embodiments. In some embodiments, capping layer 302 is made of SiN or SiON. Capping layer 302 may be formed by CVD. In some embodiments, capping layer 302 is formed by Furnace. In some embodiments, a thickness of capping layer 302 is in a range of about 200 A to about 500 A.

After capping layer 302 is formed, a chemical mechanical polishing (CMP) process 303 is performed, as shown in FIG. 3B in accordance with some embodiments. CMP process 303 is performed to remove portions of capping layer 302 and portions of second polysilicon layer 116 until dielectric layer 114 is exposed and a top surface of second polysilicon layer 116 is substantially level with a top surface of word line cell 102.

After second polysilicon layer 116 is grinded, oxide layer 304 is formed on exposed surface, which is not covered by capping layer 302, of second polysilicon layer 116, as shown in FIG. 3C in accordance with some embodiments. In some embodiments, oxide layer 304 is made of silicon oxide. In some embodiments, oxide layer 304 is formed by a thermal oxidation process, and the exposed surface of second polysilicon layer 116 is oxidized. Therefore, oxide layer 304 is self-aligned with the exposed surface of second polysilicon layer 116 and no complicated patterning techniques are required. Therefore, even when the exposed portion of second polysilicon layer 116 is small due to the scaling-down of the structure, oxide layer 304 can still be precisely aligned with the exposed portion of second polysilicon layer 116.

Next, the remaining portions of capping layer 302 are removed, as shown in FIG. 3D in accordance with some embodiments. In some embodiments, the remaining portions of capping layer 302 are removed by a wet etching process. The etching process used to remove capping layer 302 should have high selectivity toward the material of capping layer 302 and oxide layer 304. For example, when capping layer 302 is made of SiN, the etching process used to remove capping layer 302 should have high selectivity toward nitride and oxide. Therefore, only capping layer 302 is removed while oxide layer 304 is not removed by the etching process.

After capping layer 302 is removed, portions of second polysilicon layer 116 which are not covered by oxide layer 304 are removed, as shown in FIG. 3E in accordance with some embodiments. Oxide layer 304 is used as a mask during the etching process to form first polysilicon spacers 117ab and second polysilicon spacers 117bb. The polysilicon spacers, including first polysilicon spacers 117ab and second polysilicon spacers 117bb, are formed adjacent to word line cell 102. In addition, as shown in FIG. 3E, first polysilicon spacer 117ab and second polysilicon spacer 117bb have substantially the same height as word line cells 102 have.

Next, resist layer 118 is formed to cover first polysilicon spacer 117ab, as shown in FIG. 3F in accordance with some embodiments. Resist layer 118 also covers a portion of word line cell 102 in accordance with some embodiments.

After resist layer 118 is formed, second polysilicon spacer 117bb, which is not covered by resist layer 118, is removed, as shown in FIG. 3G in accordance with some embodiments. In some embodiments, second polysilicon spacer 117bb is removed by an isotropic dry etching process. Afterwards, resist layer 118 is removed.

Next, an etching process is performed to remove the exposed portions of dielectric layer 114 and oxide layer 304, as shown in FIG. 3H in accordance with some embodiments. In some embodiments, the etching process is a wet etching process. First polysilicon spacer 117ab can be seen as a memory gate 104b adjacent to word line cell 102 and is separated with word line cell 102 by dielectric layer 114.

As described previously, memory gates 104b are formed by performing CMP process 303 to second polysilicon layer 116, forming oxide layer 304, and performing the etching process afterwards. Since second polysilicon layer 116 is grinded by CMP process 303, an angle θ between the top surface and a sidewall of memory gates 104b is in a range from about 75° to about 90° in accordance with some embodiments. In some embodiments, memory gate 104b is in a shape of a rectangle. In some embodiments, the top surface of memory gate 104b is parallel to the top surface of substrate 101 (or STI 106 as shown in FIG. 3H).

In addition, during the formation of polysilicon spacers 117ab and 117bb, oxide layer 304 is used as the mask. Therefore, the size of second polysilicon spacer 117bb (which forms memory gates 104b afterwards) is precisely controlled (compared to first polysilicon spacer 117aa, which is formed by etching without using any mask structure). In addition, although the etching process needs to be performed for a long time to ensure that all polysilicon within divots 108 is removed, first polysilicon spacer 117ab (memory gates 104b) can still remain its height (or average height) $H_2$. As shown in FIG. 3H, height $H_2$ is defined as the distance between the top surface of first polysilicon spacers 117ab (memory gates 104b) and the top surface of substrate 101. In some embodiments, height $H_2$ of memory gate 104b is in a range from about 650 A to about 1500 A. In some embodiments, a ratio of height $H_2$ of memory gate 104b to height $H_1$ of word line cell 102 is in a range from about 4:5 to about 1:1.

Afterwards, spacers are formed along the sidewalls of word line cell 102 and memory gate 104b. Similar to the processes described previously, insulating film 120 is conformally formed over substrate 101 to cover word line cell 102 and memory gate 104, as shown in FIG. 3I in accordance with some embodiments. It should be noted that, although insulating film 120 shown in FIG. 3I only includes a single layer, insulating film 120 may further include multilayers in some other embodiments.

Afterwards, insulating film 120 is etched to form spacers 122ab and 122cb, as shown in FIG. 3J in accordance with some embodiments. Spacer spacer 122ab is formed on a sidewall of memory gate 104b, and spacer 122cb is formed on a sidewall of word line cell 102 opposite to memory gate 104b. Since memory gate 104b has substantially level top surface, it is easier to remove insulating film 120 formed thereon. Therefore, the sizes of spacers 122ab and 122cb are relatively large. For example, spacers 122ab and 122cb have a relatively large average height. In addition, since memory gate 104b and word line cell 102 have similar heights, spacers 122ab and 122cb also have similar average heights, as shown in FIG. 3J. In some embodiments, an average height $H_3$ of spacer 122ab is in a range from about 400 A to about 1250 A. In some embodiments, a ratio of average height $H_3$ of spacer 122ab to height $H_1$ of word line cell 102 is in a range from about 3:5 to about 4:5.

As described previously, before and after spacers 122ab and 122cb are formed, source extension regions, drain extension regions, and source and drain regions may be formed in substrate 101 (not shown). In addition, since spacers 122ab and 122cb have large sizes, the distances between source and drain regions and gate structures (e.g. control gate 110 and memory gate 104b) also increase.

Next, silicide layer 124 is formed over memory gate 104b, as shown in FIG. 3K in accordance with some embodiments. Afterwards, contact etch stop layer 126 and interlayer dielectric layer 128 are conformally formed over substrate 101 to cover word line cell 102 and memory gate 104b, as shown in FIG. 3L in accordance with some embodiments.

After interlayer dielectric layer 128 is formed, opening 130 is formed through interlayer dielectric layer 128, as shown in FIG. 3M in accordance with some embodiments. In order to completely remove contact etch stop layer 126 over memory gate 104b (e.g. on silicide layer 124), opening 130 further extend into spacers 122ab.

Next, contact 132 is formed in opening 130, as shown in FIG. 3N in accordance with some embodiments. Contact 132 has extending portion 133 extending into spacer 122ab.

As described above, since memory gate 104b has a relatively large height $H_2$ (e.g. compared to the average height of memory gate 104a), spacer 122ab, formed at the sidewall of memory gate 104b, also has a relatively large average height $H_3$ (e.g. compared to the average height of spacers 122aa). Therefore, when contact 132 has extending portion 133 extending into spacer 122ab, the distance between extending portion 133 of contact 132 and substrate 101 (or STI 106 as shown in FIG. 3N) is relatively large. As shown in FIG. 3N, a portion of spacer 122ab is in between substrate 101 (or STI 106 as shown in FIG. 3N) and extending portion 133 of contact 132, such that the extending portion 133 of contact 132 is not too close to substrate 101. Therefore, risk of leakage is decreased.

As shown in FIG. 3N, the portion of spacer 122ab between extending portion 133 of contact 132 has a height $H_4$, which is the shortest distance between contact 132 and substrate 101 (e.g. the distance between substrate 101 and the lowest part of extending portion 133 of contact 132). In some embodiments, height $H_4$ is in a range from about 350 A to about 1000 A. In some embodiments, a ratio of height $H_4$ to height $H_1$ of word line cell 102 is in a range from about 9:20 to about 14:20.

Figure 4:
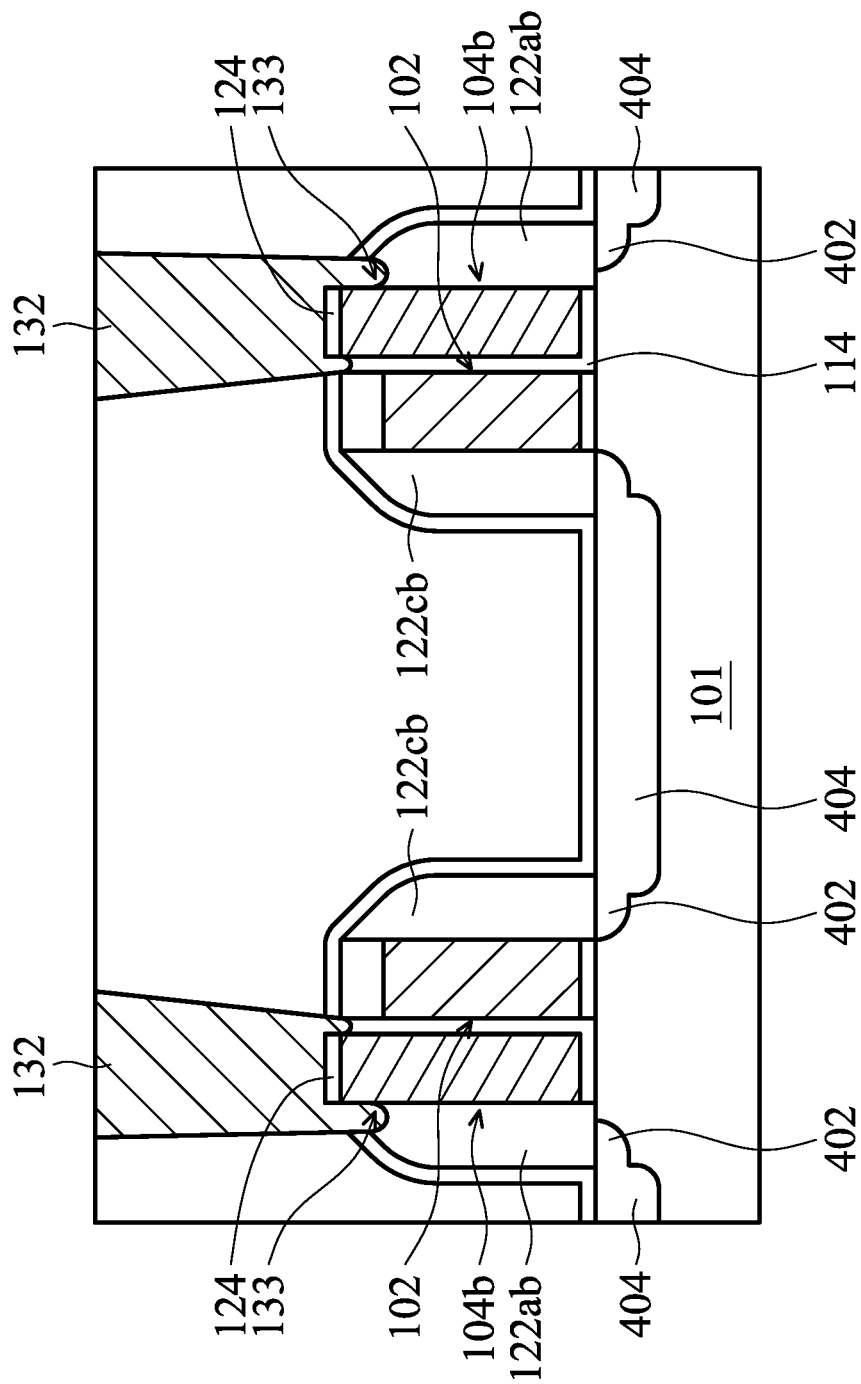
FIG. 4 illustrates a cross-sectional representation of a flash memory structure along with B-B' in FIG. 1 in accordance with some embodiments.

FIG. 4 illustrates a cross-sectional representation of a flash memory structure along with B-B' in FIG. 1 in accordance with some embodiments. The flash memory structure in FIG. 4 is similar to or the same as the flash memory structure in FIGS. 3A to 3N. However, FIG. 4 illustrates the cross-sectional representation of the flash memory structure in which word line cells 102 and memory gates 104b are formed on substrate 101. In addition, source and drain extension regions 402 and source and drain regions 404 are also shown in FIG. 4. Other elements, such as word line cells 102, memory gates 104b, and spacers 122ab and 122cb, are similar to or the same as those in FIGS. 3A to 3N, and therefore details of these elements are not repeated herein.

As mentioned above, the formation of memory gate 104b includes performing CMP process 303, forming oxide layer 304, and performing the etching process afterwards. These processes enable the formation of memory gate 104b to be of a controllable size. For example, memory gate 104b has relatively large height $H_2$ (e.g. compared to the average height of memory gate 104a). In addition, since height $H_2$ of memory gate 104b is relatively large, average height $H_3$ of spacer 122ab is also relatively large (e.g. compared to the average height of spacer 122aa). Therefore, contact 132 (especially extending portions 133 of contact 132) is far enough apart from substrate 101 that the risk of leakage is decreased. In addition, elements such as oxide layer 304 and spacers 122ab and 122cb are self-aligned to their target positions during the formation process, and therefore the size of the structure may be scaled down as required. In addition, additional operations for alignments are not required, and the fabrication processes and cost of forming the flash memory structure are decreased.

Embodiments of a flash memory structure are provided. The flash memory structure includes a word line cell, a memory gate adjacent to the word line cell, and a spacer aligned with the memory gate formed over a substrate. A size of the memory gate is precisely controlled. In addition, heights of the memory gate and the spacer are relatively large. The spacer with the relatively large average height prevents contact from being too close to, or even directly contacting, the substrate. Therefore, leakage is avoided.

In some embodiments, a semiconductor structure is provided. The semiconductor structure includes a substrate and a first gate electrode formed over the substrate. The semiconductor structure further includes a dielectric layer formed on a sidewall of the first gate electrode and a second gate electrode formed over the substrate and separated from the first gate electrode by the dielectric layer. The semiconductor structure further includes a contact formed over the second gate electrode. In addition, the contact has a first extending portion and a second extending portion extending along opposite sidewalls of the second gate electrode.

In some embodiments, a semiconductor structure is provided. The semiconductor structure includes a substrate and a first gate electrode formed over the substrate. The semiconductor structure further includes a dielectric layer formed on a sidewall of the first gate electrode and a second gate electrode formed on the dielectric layer. The semiconductor structure further includes a silicide layer formed on the second gate electrode and a first spacer formed on a first sidewall of the second gate electrode. The semiconductor structure further includes a contact formed over the silicide layer. In addition, the contact has a first extending portion, and a bottom surface of the first extending portion is lower than a bottom surface of the silicide layer.

In some embodiments, a semiconductor structure is provided. The semiconductor structure includes a substrate and a first gate electrode formed over the substrate. The semiconductor structure further includes an insulating layer formed on the first gate electrode and a dielectric layer formed on sidewalls of the first gate electrode and the insulating layer. The semiconductor structure further includes a second gate electrode formed over the dielectric layer and separated from the first gate electrode by the dielectric layer and a contact formed over the second gate electrode. In addition, the contact extends between the second gate electrode and the insulating layer.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device structure, comprising:
a substrate;
a first gate electrode formed over the substrate;
a dielectric layer formed on a sidewall of the first gate electrode;
a second gate electrode formed over the substrate and separated from the first gate electrode by the dielectric layer;
a silicide layer formed over the second gate electrode; and
a contact formed over the silicide layer over the second gate electrode,
wherein the contact has a first extending portion and a second extending portion extending along opposite sidewalls of the second gate electrode, and a bottommost of the first extending portion of the contact and a bottommost of the second extending portion of the contact are lower than an interface between the silicide layer and the second gate electrode.

2. The semiconductor device structure as claimed in claim 1, wherein the bottommost of the first extending portion of the contact is lower than the bottommost of the second extending portion of the contact.

3. The semiconductor device structure as claimed in claim 2, wherein the bottommost of the second extending portion of the contact is higher than a top surface of the first gate electrode.

4. The semiconductor device structure as claimed in claim 1, further comprising:
a spacer formed on a sidewall of the second gate electrode,
wherein the first extending portion of the contact is in direct contact with the spacer, and the second extending portion of the contact is in direct contact with the dielectric layer.

5. The semiconductor device structure as claimed in claim 4, wherein a topmost of the spacer is higher than a bottommost of first extending portion of the contact.

6. The semiconductor device structure as claimed in claim 5, wherein the topmost of the spacer is higher than a top surface of the first gate electrode.

7. The semiconductor device structure as claimed in claim 4, wherein an outer sidewall of the first extending portion is located between an inner sidewall of the spacer and an outer sidewall of the spacer.

8. A semiconductor device structure, comprising:
a substrate;
a first gate electrode formed over the substrate;
a dielectric layer formed on a sidewall of the first gate electrode;
a second gate electrode formed on the dielectric layer;
a silicide layer formed on the second gate electrode;
a first spacer formed on a first sidewall of the second gate electrode; and
a contact formed over the silicide layer, wherein the contact has a first extending portion, and a bottom surface of the first extending portion is lower than a bottom surface of the silicide layer, and an outer sidewall of the first extending portion is covered by the first spacer.

9. The semiconductor device structure as claimed in claim 8, wherein the first extending portion of the contact is in direct contact with the first spacer.

10. The semiconductor device structure as claimed in claim 8, wherein the first extending portion of the contact extends into the first spacer.

11. The semiconductor device structure as claimed in claim 8, wherein the dielectric layer is located on a second sidewall of the second gate electrode so that the first gate electrode and the second gate electrode are separated by the dielectric layer.

12. The semiconductor device structure as claimed in claim 11, wherein the contact has a second extending portion in direct contact with the dielectric layer.

13. The semiconductor device structure as claimed in claim 12, further comprising:
an insulating layer formed on the first gate electrode; and
a second spacer formed on a sidewall of the first gate electrode and a sidewall of the insulating layer,
wherein the second extending portion of the contact extends between the second gate electrode and the insulating layer.

14. The semiconductor device structure as claimed in claim 13, wherein the second extending portion of the contact is in direct contact with the insulating layer.

15. A semiconductor device structure, comprising:
a substrate;
a first gate electrode formed over the substrate;
an insulating layer formed on the first gate electrode;
a dielectric layer formed on sidewalls of the first gate electrode and the insulating layer;
a second gate electrode formed over the dielectric layer and separated from the first gate electrode by the dielectric layer; and a contact formed over the second gate electrode, wherein the contact sandwiched between the second gate electrode and the insulating layer, and a top surface of the insulating layer is substantially level with a top surface of the second gate electrode.

16. The semiconductor device structure as claimed in claim 15, wherein an interface between the contact and the dielectric layer is lower than a top surface of the insulating layer.

17. The semiconductor device structure as claimed in claim 16, wherein the interface between the contact and the dielectric layer is higher than a top surface of the first gate electrode.

18. The semiconductor device structure as claimed in claim 15, further comprising:

a spacer formed on a sidewall of the second gate electrode, wherein the contact further extends into the spacer.

19. The semiconductor device structure as claimed in claim 18, wherein an interface between the contact and the spacer is lower than a top surface of the second gate electrode.

20. The semiconductor device structure as claimed in claim 19, wherein the interface between the contact and the spacer is higher than a top surface of the first gate electrode.

* * * * *